US008267758B2

(12) United States Patent
Liu

(10) Patent No.: US 8,267,758 B2
(45) Date of Patent: Sep. 18, 2012

(54) THERMAL MODULE AND METHOD FOR CONTROLLING HEAT-DISSIPATION WIND AMOUNT THEREOF

(75) Inventor: Hsiang-Chao Liu, Tao Yuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 1665 days.

(21) Appl. No.: 11/270,513

(22) Filed: Nov. 10, 2005

(65) Prior Publication Data

US 2007/0017665 A1 Jan. 25, 2007

(30) Foreign Application Priority Data

Jun. 27, 2005 (TW) .............................. 94121504 A

(51) Int. Cl.
*H05K 7/20* (2006.01)
(52) U.S. Cl. ....................................... 454/184
(58) Field of Classification Search ................... 454/184
See application file for complete search history.

(56) References Cited

U.S. PATENT DOCUMENTS

| 4,800,951 | A | * | 1/1989 | Sakurai .......................... 165/203 |
| 6,181,557 | B1 | * | 1/2001 | Gatti ............................. 361/695 |
| 6,628,520 | B2 | * | 9/2003 | Patel et al. .................... 361/696 |
| 2004/0065652 | A1 | * | 4/2004 | Matsunaga et al. ........... 219/205 |

FOREIGN PATENT DOCUMENTS

| CN | 2035064 U | 3/1989 |
| CN | 1332398 A | 1/2002 |
| CN | 1414442 A | 4/2003 |

* cited by examiner

*Primary Examiner* — Steven B McAllister
*Assistant Examiner* — Samantha Miller
(74) *Attorney, Agent, or Firm* — Rabin & Berdo, P.C.

(57) ABSTRACT

A thermal module and method for controlling heat-dissipation wind amount thereof is provided. The thermal module is figured in an electronic apparatus having a first heat source and a second heat source. The thermal module includes at least a first wind outlet, a second wind outlet and a first wind-amount adjuster. The first wind outlet is for providing a first wind amount to the first heat source while the second wind outlet is for providing a second wind amount to the second heat source. The first wind-amount adjuster, disposed at the first wind outlet, is for adjusting the first wind amount according to temperature of the first heat source and the second heat source.

17 Claims, 5 Drawing Sheets

| T1/T2 | D1/D2 |
|---|---|
| ... | ... |
| 1/4<T1/T2≦3/8 | 1/4 |
| 3/8<T1/T2≦1/2 | 1/2 |
| 1/2<T1/T2≦3/4 | 2/3 |
| ... | ... |

| T1−T2 (°C) | D1/D2 |
|---|---|
| ... | ... |
| −50≦T1−T2<−35 | 1/4 |
| −35≦T1−T2<−20 | 1/2 |
| −20≦T1−T2<−5 | 2/3 |
| ... | ... |

THERMAL MODULE AND METHOD FOR CONTROLLING HEAT-DISSIPATION WIND AMOUNT THEREOF

This application claims the benefit of Taiwan application Serial No. 94121504, filed Jun. 27, 2005, the subject matter of which is incorporated herein by reference.

BACKGROUND OF THE INVENTION

1. Field of the Invention

The invention relates in general to a thermal module and method for controlling heat-dissipation wind amount thereof, and more particularly to a thermal module, which adjusts heat-dissipation wind amount according to temperatures of at least two heat sources, and method for controlling heat-dissipation wind amount thereof.

2. Description of the Related Art

Along with technology development, various electronic products, such as notebook computers, desktop computers, servers, and power supplies, bring convenience into people's daily lives. The performance of the electronic products is directly influenced by their heat-dissipation effect. The heat sources disposed in these electronic products are, for example, a central processing unit (CPU), a hard disk, a chipset or a light bulb. Owing that the electronic products tend to be light, thin and small in development, heat energy cannot be effectively dissipated within a limited space. Therefore, a thermal module has to be used to remove off extra heat energy. Furthermore, the electronic apparatus usually includes not only a heat source, and thus a common-used thermal module has at least two wind outlets for removing heat from two heat sources.

Referring to FIG. 1, a block diagram of an electronic apparatus including a thermal module having two wind outlets is shown. The thermal module 130, disposed in an electronic apparatus 100, includes blades 131, and a casing 132. The casing 132 has a first wind outlet 132a and a second wind outlet 132b. The first wind outlet 132a has a first outlet width D1 while the second wind outlet 132b has a second outlet width D2. A first fin device 110 is connected to the first heat source 110 and disposed outside the first wind outlet 132a. A second fin device 120a is connected to the second heat source 120 and disposed outside the second wind outlet 132b. When the electronic apparatus 100 is used for a long time, heat energy generated by the first heat source 110 and the second heat source 120 is respectively propagated to the first fin device 110a and the second fin device 120a. When the blades 131 rotate clockwise, cool air is absorbed into the thermal module 130 from the upper side and the lower side of the blades 131 to separately flow through the first wind outlet 132 and the second wind outlet 132b. The heat-dissipation wind having a first wind amount W1 and the heat-dissipation wind having a second wind amount W2 respectively flows through the first fin device 110a and the second fin device 120a and takes away heat energy carried thereon to help removing heat energy from the first heat source 110 and the second heat source 120.

The first operation temperature T1 and the second operation temperature T2 of the first heat source 110 and the second heat source 120 depend on the usage situation of the electronic apparatus 100. However, the thermal module 130, having the fixed first outlet width D1 and second outlet width D2, cannot adjust the ratio of the first wind amount W1 and the second wind amount W2 and thus cannot meet the heat-dissipation requirement of the electronic apparatus 100 under different usage situations.

Furthermore, although the first wind amount W1 and the second wind amount W2 can be increased by enlarging the rotation speed of the blades 131 in the traditional thermal module 130, overlarge amount of cool air is used in heat dissipation of the heat source generating relatively lower heat energy due to difference of the first operation temperature T1 and the second operation temperature T2. On the other hand, when the blades 131 rotate slower, the first wind amount W1 and the second wind amount W2 are lowered down simultaneously. As a result, insufficient cool air is supplied to remove heat energy from the heat source having relatively higher heat energy due to the difference of the first operation temperature T1 and the second operation temperature T2.

SUMMARY OF THE INVENTION

It is therefore an object of the invention to provide a thermal module and method for controlling heat-dissipation wind amount thereof. By using a first wind-amount adjuster disposed at the first wind outlet, the first outlet width can be changed to adjust the first wind amount and the second amount to have the optimum usage proportion. As a result, the best percentage of the first and the second wind amount can be arrange according to the first and the second operation temperatures to improve the cooling performance of the thermal module.

The invention achieves the above-identified object by providing a thermal module disposed in an electronic apparatus. The electronic apparatus has a first heat source and a second heat source. The thermal module includes a first wind outlet, a second wind outlet and a first wind-amount adjuster. The first wind outlet is for providing a first wind amount to the first heat source while the second wind outlet is for providing a second wind amount to the second heat source. The first wind-amount adjuster, disposed at the first wind outlet, is for adjusting the first wind amount according to temperature of the first heat source and the second heat source.

The invention achieves the above-identified object by providing an electronic apparatus including a first heat source, a second heat source, a thermal module, and a control unit. The thermal module includes at least a first wind outlet, a second wind outlet, and a first wind-amount adjuster. The first wind outlet is for providing a first wind amount for the first heat source. The second wind outlet is for providing a second wind amount for the second heat source. The first wind-amount adjuster, disposed at the first wind outlet, is for adjusting the first wind amount. The control unit is for controlling the first wind-amount adjuster to adjust the first wind amount according to temperatures of the first heat source and the second heat source.

The invention achieves the above-identified object by providing a method for controlling heat-dissipation wind amount applied in an electronic apparatus. The electronic apparatus uses a thermal module to respectively provide a first wind amount and a second wind amount for a first heat source and a second heat source. The method includes detecting a first operation temperature of the first heat source and a second operation temperature of the second heat source; and adjusting at least the first wind amount according to the first operation temperature and the second operation temperature.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 4 is a temperature ratio lookup table according to the control method of FIG. 3.

FIG. 5 is a temperature difference lookup table according to the control method of FIG. 3.

DETAILED DESCRIPTION OF THE INVENTION

Figure 1:
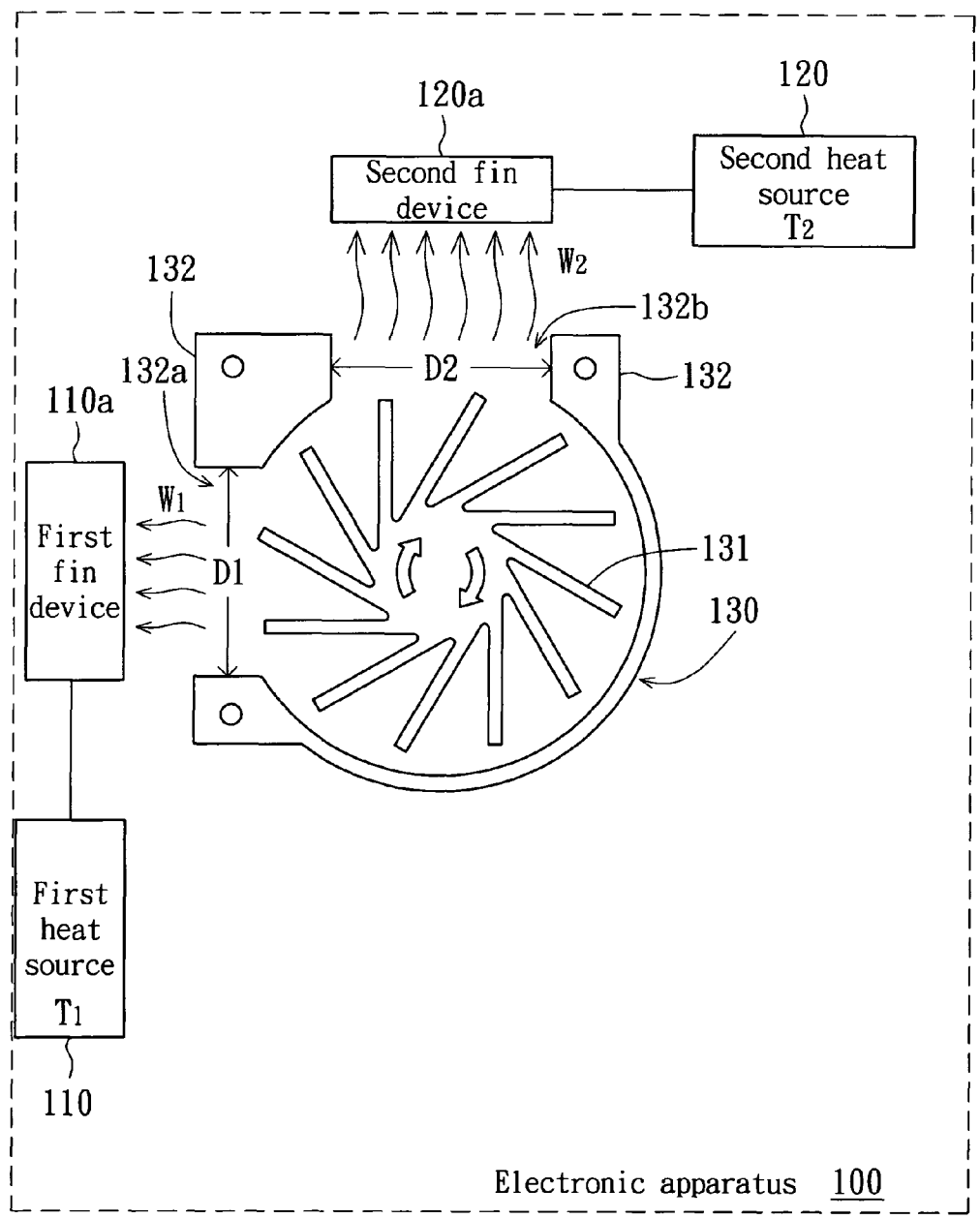
FIG. 1 (Prior Art), a block diagram of an electronic apparatus including a thermal module having two wind outlets.
Figure 2A:
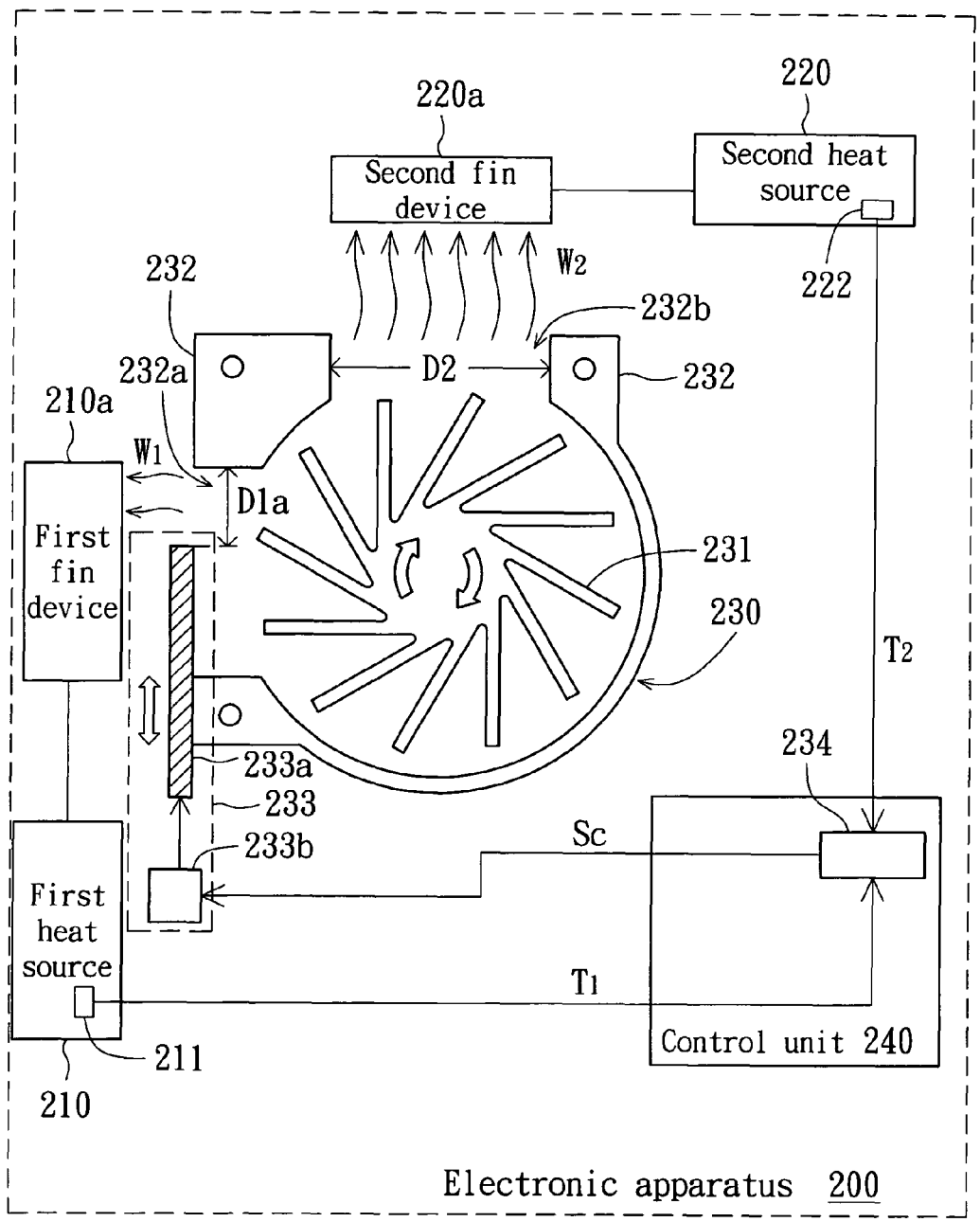
FIG. 2A is a block diagram of the electronic apparatus according to a preferred embodiment of the invention.

Referring to FIG. 2A, a block diagram of the electronic apparatus according to a preferred embodiment of the invention is shown. The electronic apparatus 200, such as a notebook computer, a desktop computer, a projector, a server, or a power supply, includes a first heat source 210, a first fin device 210a, a second heat source 220, a second fin device 220a, a thermal module 230 and a control unit 240. In the embodiment, the first heat source 210 is a central processing unit (CPU) and includes a first temperature sensing device 211 while the second heat source 220 is a chipset and includes a second temperature sensing device 222. The thermal module 230 includes blades 231, a casing 232, and a first wind-amount adjuster 233. The blades 231 are disposed inside the casing 232, which has a first wind outlet 232a and a second wind outlet 232b. The first wind-amount adjuster 233 includes a first gate 233a and a driving device 233b. The control unit 240, such as a south bridge, includes a thermal integrated circuit (IC) 234 for outputting a control signal Sc to the driving device 233b of the first wind-amount adjuster 233 according to the temperature information provided by the first temperature sensing device 211 and the second temperature sensing device 222 in order to change the position of the first gate 233a. The first fin device 210a is connected to the first heat source 210 and disposed outside the first wind outlet 232a. The second fin device 220a is connected to the second heat source 220 and disposed outside the second wind outlet 232b. The first fin device 210a and the second fin device 220a are good heat conductors. When the electronic apparatus 200 is used for a long time, heat energy generated by the first heat source 210 and the second heat source 220 is respectively propagated to the first fin device 210a and the second fin device 220a. When the blades 231 rotate clockwise, cool air is absorbed into the casing 232 from the upper side and the lower side of the blades 231 and flow toward the first wind outlet 232a and the second wind outlet 232b. The cool air flowing out of the first wind outlet 232a has a first wind amount W1 and flows through the first fin device 210a to take away heat energy carried thereon while the cool air flowing out of the second wind outlet 232b has a second wind amount W2 and flow through the second fin device 220a to take away heat energy carried thereon. Therefore, the heat energy generated by the first heat source 210 and the second heat source 220 can be dissipated out.

Figure 2B:
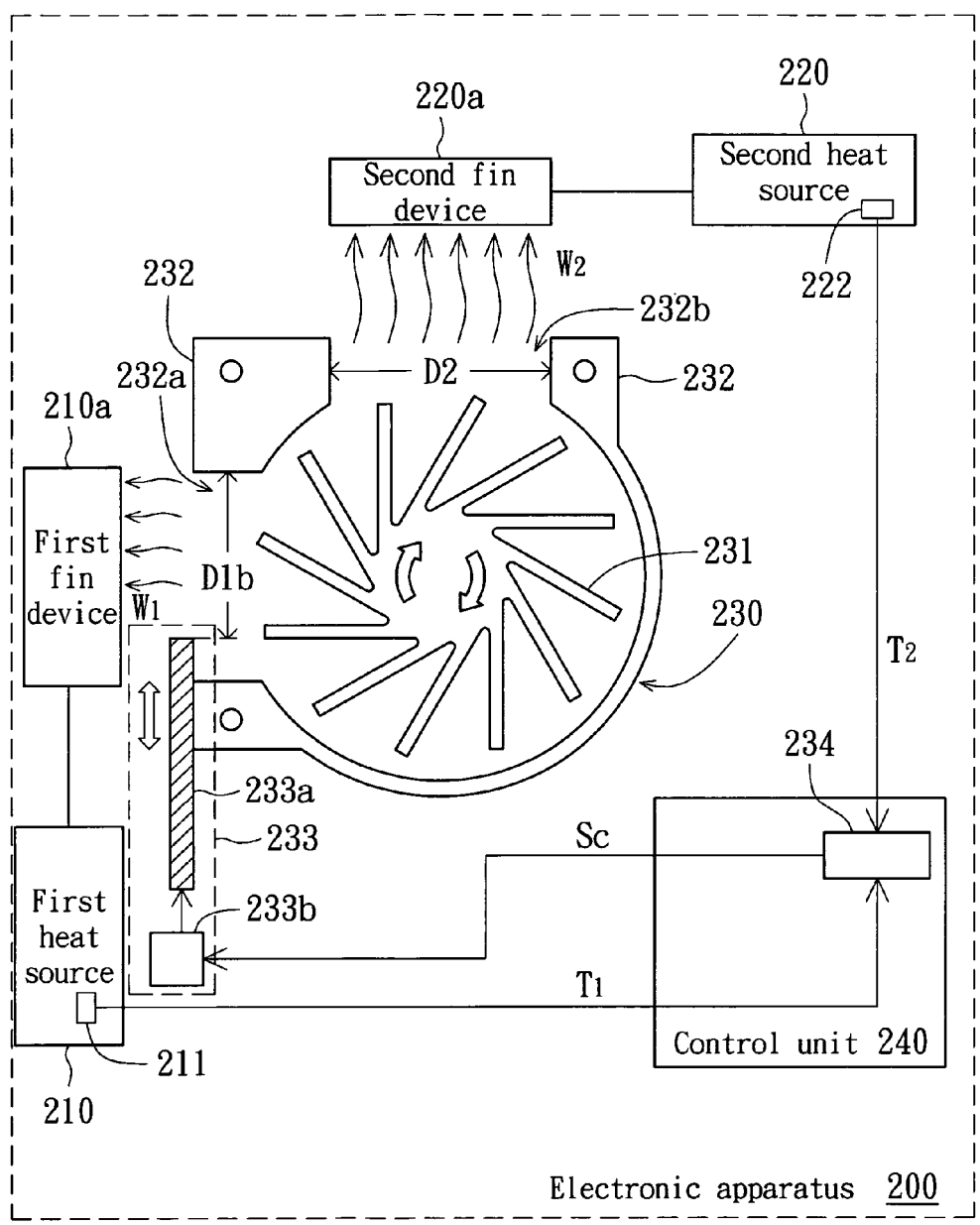
FIG. 2B is a block diagram of the electronic apparatus 200 of FIG. 2A at another operational state.

FIG. 2B is a block diagram of the electronic apparatus 200 of FIG. 2A at another operational state. As shown in FIG. 2A, when the first operation temperature T1 of the first heat source 210, such as 30° C., is much smaller than the second operation temperature T2 of the second heat source 220, such as 80° C., the first outlet width D1a is much smaller than the second outlet width D2. The first wind outlet D1a and the second outlet width D2 have a ratio 1:4 and thus the first wind amount W1 and the second wind amount have about a ratio 1:4 to achieve the better heat-dissipation efficiency. As shown in FIG. 2B, when the first operation temperature T1 of the first heat source 210 is increased to 50° C. for instance, or the second operation temperature T2 is decreased to 60° C. for instance, the thermal module 230 increases the first outlet width to D1b such that the first outlet width D1b and the second outlet width D2 have a ratio of 2:3. As a result, the first wind amount W1 is increased and the second wind amount W2 is decreased to achieve better heat dissipation efficiency by a ratio 2:3 of W1 and W2.

Figure 3:
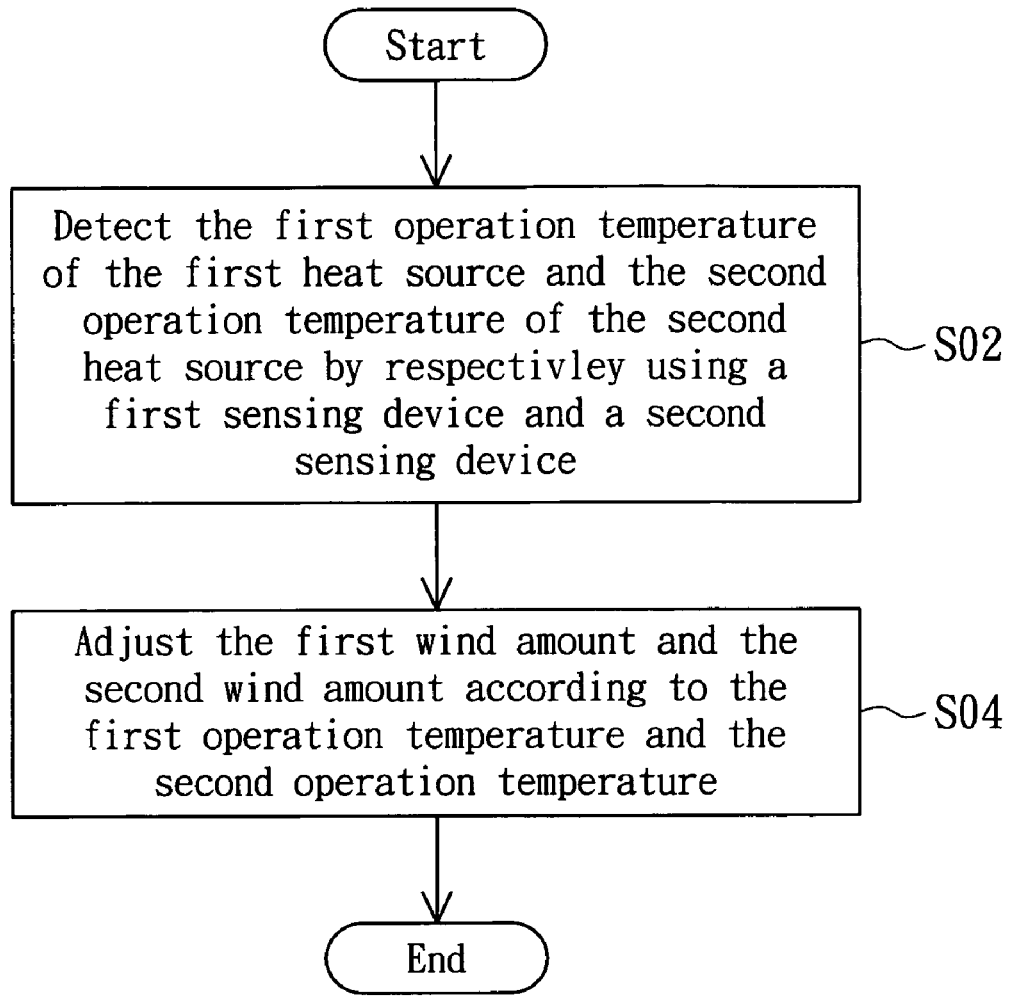
FIG. 3 is a flow chart of the method for controlling heat-dissipation wind according to the preferred embodiment of the invention.

Referring to FIG. 3, a flow chart of the method for controlling heat-dissipation wind according to the preferred embodiment of the invention is shown. First, in step S02, detect the first operation temperature T1 of the first heat source 210 and the second operation temperature T2 of the second heat source 220 by respectively using a first sensing device 211 and a second sensing device 222. The first sensing device 211 and the second sensing device 222 are, for example, thermal diodes respectively embedded in the first heat source 210 and the second heat source 220. Next, in step S04, adjust the first wind amount according the first operation temperature T1 and the second operation temperature T2. As shown in FIG. 2A, in the embodiment, the control unit 240 outputs the control signal Sc to the driving device 233b to adjust the position of the first gate 233a and thus change the width of the first wind outlet 232a according to the ratio of the first operation temperature T1 and the second operation temperature T2.

When the first operation temperature T1 of the first heat source 210 and the second operation temperature T2 of the second heat source 220 are respectively 30° C. and 80° C., the control unit 240 obtains the required ratio value, such as ¼, of the first outlet width D1 and the second outlet width D2 by checking the embedded lookup table 400 in FIG. 4 according to the ratio value ⅜ of the two operation temperatures T1 and T2. Then the control unit 240 outputs the control signal Sc according to the ratio value ¼ to control the position of the first gate 233a and adjust the first outlet width to D1a such that the two outlet width D1a and D2 has a ratio value ¼. At the time, the ratio of the first wind amount W1 and the second wind amount W2 is also about ¼. As a result, the larger second wind amount W2 can be supplied to the second heat source 220 generating larger heat energy while the smaller first wind amount W1 can be supplied to the first heat source 210 generating smaller heat energy to achieve better heat dissipation efficiency.

As shown in FIG. 2B, when the electronic apparatus 200 changes its operational status in which the operation temperature T1 of the first heat source 210 is increased to 50° C. and the operation temperature T2 of the second heat source 220 is decreased to 70° C., the control unit 240 obtains the required ratio value, such as ⅔, of the first outlet width D1 and the second outlet width D2 by checking the embedded lookup table 400 in FIG. 4 according to the ratio value 5/7 of the two operation temperatures T1 and T2. Then the control unit 240 outputs the control signal Sc according to the ratio value ⅔ to control the position of the first gate 233a and adjust the first outlet width to D1b such that the two outlet width D1a and D2 has a ratio value ⅔. At the time, the ratio of the first wind amount W1 and the second wind amount W2 is also about ⅔. As a result, the suitable first wind amount W1 and second wind amount W2 can be respectively supplied to first heat source 210 and the second heat source 220 to achieve better heat dissipation efficiency.

As described above, although the invention is exemplified by adjusting the first wind amount and the second wind amount according to the ratio of the two operation temperatures T1 and T2, the control unit 240 of the invention can also adjust the first wind amount W1 and the second wind amount W2 according to the difference value (T1−T2) of the operation temperatures T1 and T2. For example, when the operation temperatures T1 and T2 are respectively 30° C. and 80° C., the control unit obtains the required ratio ¼ of D1 and D2 and controls the position of the first gate 233a accordingly to have a ratio ⅔ of W1 and W2 to achieve better heat dissipation efficiency by checking the embedded lookup table 500 in FIG. 5 according to the temperature difference (T1−T2), which is −50° C. The control unit 240 of the invention can even use other data analytic methods to control the first and the second wind amount. As long as the first and the second wind amount an be adjusted according to the operation temperatures T1 and T2 to achieve the purpose of increasing heat dissipation efficiency, all these alternatives are not apart from the scope of the invention.

The first gate 233a can be driven by a magnetic method or a mechanism of expanding when hot and shrinking when cold. The ratio of the first wind amount W1 and the second wind amount W2 is changed along the ratio of the first outlet width and the second outlet width.

As described above, although the first wind-amount adjuster 233 of the electronic apparatus 200 is exemplified to have the first gate 233a, the wind-amount adjuster 233 in the electronic apparatus 200 of the invention can also be implemented by way of valve, and the position of the gate or the valve can be controlled mechanically, magnetically, or by a mechanism of expanding when hot and shrinking when cold. As long as the wind-amount adjuster 233 can be controlled according to the operation temperatures T1 and T2 to adjust the first wind amount and the second wind amount to achieve better heat dissipation efficiency, all these will not depart from the scope of the invention.

As illustrated above, although the CPU and the chipset are respectively taken as an example for the first heat source 210 and the second heat source 220 in the electronic apparatus 200 of the invention, the first heat source 210 and the second heat source 220 of the invention can also be other heat-generating source, such as a hard disk or a light bulb. Besides, although the first wind-amount adjuster 233 of the electronic apparatus 200 is exemplified to be disposed at the first wind outlet, the electronic apparatus 200 of the invention can also includes a second wind-amount adjuster disposed at the second wind outlet 232b for adjusting the width D2 of the second wind outlet 232b. The control unit 240 can adjust the first outlet width D1 and the second outlet width D2 simultaneously to provide the required first wind amount W1 and second wind amount W2 and achieve better heat dissipation efficiency. Therefore, all these will not be apart from the scope of the invention.

In the thermal module and method for controlling heat-dissipation wind amount thereof disclosed by the above-mentioned embodiment of the invention, the first wind-amount adjuster disposed at the first wind outlet can suitably adjust the ratio of the first and the second wind amount by changing the width of the first wind outlet according to different operational states of the electronic apparatus in order to provide the heat-dissipation wind required for the different heat sources. Consequently, the optimum amount ratio of the heat-dissipation wind generated from the outlets can be determined according to operation temperatures of the different heat sources to prevent energy waste and improve the heat dissipation efficiency of the electronic apparatus.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A thermal module, disposed in an electronic apparatus, the electronic apparatus having a first heat source and a second heat source, the thermal module comprising:
   a first wind outlet, for providing a first wind amount to the first heat source;
   a second wind outlet, for providing a second wind amount to the second heat source; and
   a first wind-amount adjuster, disposed at the first wind outlet, for adjusting the first wind amount according to temperature of the first heat source and the second heat source;
   wherein the first wind-amount adjuster adjusts an opening of the first wind outlet according to a temperature ratio of temperatures of the first heat source and the second heat source to obtain a predetermined ratio of the first wind amount and the second wind amount corresponding to the temperature ratio; wherein when the temperature ratio of temperatures of the first heat source and the second heat source is increased, the predetermined ratio of the first wind amount and the second wind amount corresponding to the temperature ratio is increased.

2. The thermal module according to claim 1, wherein the first wind-amount adjuster comprises a first gate for adjusting the size of the first wind outlet.

3. The thermal module according to claim 1, wherein the electronic apparatus comprises a control unit for outputting a control signal according to the temperatures of the first heat source and the second heat source, and the first wind-amount adjuster adjusts the first wind amount according to the control signal.

4. The thermal module according to claim 1, further comprising a second wind-amount adjuster disposed at the second wind outlet for adjusting the second wind amount according to the temperatures of the first heat source and the second heat source.

5. The thermal module according to claim 4, wherein the second wind-amount adjuster comprises a second gate for adjusting the size of the second wind outlet.

6. An electronic apparatus, comprising:
   a first heat source and a second heat source;
   a thermal module, comprising at least:
      a first wind outlet, for providing a first wind amount for the first heat source;
      a second wind outlet, for providing a second wind amount for the second heat source; and
      a first wind-amount adjuster, disposed at the first wind outlet, for adjusting the first wind amount; and
   a control unit, for controlling the first wind-amount adjuster to adjust the first wind amount according to temperatures of the first heat source and the second heat source
   wherein the control unit controls the first wind-amount adjuster to adjust an opening of the first wind outlet according to a temperature difference of temperatures of the first heat source and the second heat source to obtain a predetermined ratio of the first wind amount and the second wind amount corresponding to the temperature difference; wherein when the temperature difference of temperatures of the first heat source and the second heat source is increased, the predetermined ratio of the first wind amount and the second wind amount corresponding to the temperature difference is increased.

7. The electronic apparatus according to claim 6, wherein the first heat source is a central processing unit (CPU), a hard disk, a chipset, a light bulb or another heat-generating device.

8. The electronic apparatus according to claim 6, wherein the second heat source is a central processing unit (CPU), a hard disk, a chipset, a light bulb or another heat-generating device.

9. The electronic apparatus according to claim 6, wherein the first wind-amount adjuster comprises a first gate for adjusting the size of the first wind outlet.

10. The electronic apparatus according to claim 6, wherein the control unit is a thermal integrated circuit.

11. The electronic apparatus according to claim 6, wherein the electronic apparatus is a notebook computer, a desktop computer, a projector, a server, or a power supply.

12. The electronic apparatus according to claim 6, wherein the thermal module further comprises a second wind-amount adjuster disposed at the second wind outlet for adjusting the second wind amount according to the control unit.

13. The electronic apparatus according to claim 12, wherein the second wind-amount adjuster comprises a second gate, for adjusting the size of the second wind outlet.

14. A method for controlling heat-dissipation wind amount, applied in an electronic apparatus, the electronic apparatus using a thermal module to respectively provide a first wind amount and a second wind amount for a first heat source and a second heat source, the method comprising:

detecting a first operation temperature of the first heat source and a second operation temperature of the second heat source;

calculating a temperature ratio or difference of the first operation temperature and the second operation temperature; and adjusting at least the first wind amount according to the temperature ratio or difference to obtain a predetermined ratio of the first wind amount and the second wind amount corresponding to the temperature ratio or difference; wherein when the temperature ratio or difference of the first operation temperature and the second operation temperature is increased, the predetermined ratio of the first wind amount and the second wind amount corresponding to the temperature ratio or difference is increased.

15. The method according to claim 14, wherein the step of adjusting at least the first wind amount further comprises adjusting the second wind amount according to the temperature ratio or difference of the first operation temperature and the second operation temperature.

16. The method according to claim 14, wherein the thermal module comprises a first wind outlet for providing the first wind amount and the step of adjusting at least the first wind amount comprises changing the size of the first wind outlet to adjust the first wind amount.

17. The method according to claim 16, wherein the step of adjusting at least the first wind amount comprises adjusting the first wind amount by changing the position of a first gate disposed at the first wind outlet.

\* \* \* \* \*